US006931243B2

(12) United States Patent
Goldman

(10) Patent No.: US 6,931,243 B2
(45) Date of Patent: Aug. 16, 2005

(54) FULLY INTEGRATED LOW NOISE MULTI-LOOP SYNTHESIZER WITH FINE FREQUENCY RESOLUTION FOR HDD READ CHANNEL AND RF WIRELESS LOCAL OSCILLATOR APPLICATIONS

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 367 days.

(21) Appl. No.: 10/036,831

(22) Filed: Dec. 21, 2001

(65) Prior Publication Data

US 2003/0119466 A1 Jun. 26, 2003

(51) Int. Cl.[7] ................................................. H04B 1/06
(52) U.S. Cl. ....................... 455/260; 455/183.1; 455/76
(58) Field of Search ................................ 455/260, 255, 455/256, 257, 258, 259, 296, 183.1, 183.2, 184.1, 189.1, 190.1, 180.1–182.3, 173.1, 165.1, 76, 63.1, 62, 66.1, 67.11, 418, 419, 425, 561, 575.1, 550.1, 265, 75, 150.1, 147, 264, 192.1, 326, 333, 3.01, 452.1; 331/1 R, 158, 175, 176, 179, 2; 327/156, 105; 375/376, 355; 330/252, 254, 260

(56) References Cited

U.S. PATENT DOCUMENTS

| | | | | |
|---|---|---|---|---|
| 4,072,905 A | * | 2/1978 | Keelty | 329/302 |
| 4,528,522 A | * | 7/1985 | Matsuura | 331/2 |
| 5,015,971 A | * | 5/1991 | Taylor et al. | 331/16 |
| 5,353,311 A | * | 10/1994 | Hirata et al. | 375/135 |
| 5,757,867 A | * | 5/1998 | Caulfield et al. | 375/350 |
| 6,115,586 A | * | 9/2000 | Bezzam et al. | 455/112 |
| 6,163,684 A | * | 12/2000 | Birleson | 455/182.3 |
| 6,396,330 B1 | * | 5/2002 | Fujii | 327/355 |
| 2002/0118308 A1 | * | 8/2002 | Dujmenovic | 348/731 |

OTHER PUBLICATIONS

"A Fast Locking Scheme for PLL Frequency Synthesizers", National Semiconductor, Application Note 1000, David Byrd, Craig Davis, William O. Keese, Jul., 1995, 6 pages, reprinted from the Internet at WWW.National.Com.
"CMOS Gilbert Cell Mixer", reprinted from the Internet at: http://rcaverly.ee.vill.edu/cmosrf/gilbert.htm, Oct. 26, 2001, 4 pages.
"Transmitter & Receiver Architectures", Making Wireless Work, Radio Design Course, Andrew Bateman, reprinted from the Internet at http:www.avren.com/Courses/TX_RX_Architectures_plain.htm. Oct. 23, 2001, 21 pages.

* cited by examiner

*Primary Examiner*—Edward F. Urban
*Assistant Examiner*—Charles Chow
(74) *Attorney, Agent, or Firm*—Wade James Brady, III; Frederick J. Telecky, Jr.

(57) ABSTRACT

A low noise multi-loop radio frequency synthesizer receives an input reference signal having a frequency $f_R$, into a fine tune PLL and a coarse tune PLL. The fine tune PLL outputs a fine tune signal with a frequency $f_R\Box P$, P beings an integer, while the coarse tune PLL outputs a coarse tune signal with frequency $f_R\Box A$, where A is an integer. A translation PLL has a unity multiplication factor and is driven by the fine tune signal output. The frequency synthesizer has a Gilbert cell double balanced mixer coupled between the coarse tune and the translation PLLs, the Gilbert cell mixer combining the coarse tune signal and the output signal of the translation PLL and coupling the mixed signal into the translation PLL. The translation loop outputs a signal with a frequency proportional to the linear sum of the coarse tune signal and the fine tune signal.

16 Claims, 11 Drawing Sheets

FULLY INTEGRATED LOW NOISE MULTI-LOOP SYNTHESIZER WITH FINE FREQUENCY RESOLUTION FOR HDD READ CHANNEL AND RF WIRELESS LOCAL OSCILLATOR APPLICATIONS

TECHNICAL FIELD OF INVENTION

The present invention relates generally to the field of frequency synthesizers, and more specifically to a low phase noise multi-loop RF synthesizer, operable to generate a frequency which can be programmed in fine steps, and frequency modulated to provide broad bandwidth into the microwave frequency range and which may be fully integrated on a semiconductor chip.

BACKGROUND OF THE INVENTION

The frequency synthesizer is commonly used in radio frequency devices to provide generation of local oscillator (LO) high frequency signals. Applications include, for example, the read channel in a hard disk drive, and for RF wireless communications such as cellular and digital cordless telephone local oscillator applications. Several of these applications require low phase noise and small frequency steps of the frequency synthesizer.

The read channel of a hard disk drive, for example, requires a synthesizer to generate clock frequencies of 180–500 MHz in 1 MHz steps for the timing recovery loop. The small frequency steps and wide output frequency range are required to adjust for the various data rates that hard disk manufacturers desire, with a phase noise low enough to have a >30 dB signal to noise ratio (S/N).

For an RF wireless application, a transmitter and receiver require a synthesizer to up convert and down convert modulated and received signals. In the RF wireless example, a clock frequency of 1100–1200 MHz in small 200 KHz steps is required of the synthesizer to meet the channel spacing requirements. Here again, low phase noise is required to have a high sensitivity in the receiver and not allow noise power to spill over into adjacent channels. In addition, the need is especially great in the RF wireless and other hand held portable device applications to integrate the entire synthesizer and VCO on a single semiconductor chip, for size, power, manufacturing, and economic reasons.

The phase locked loop (PLL) forms the basis of most modern carrier generation synthesizer solutions. The synthesizer technique aims to get a high quality (low phase noise), high frequency oscillator to be locked to a stable, low level, low cost (often crystal derived) source.

Two important factors affecting the design of a carrier frequency source are frequency stability and phase noise. Frequency stability generally refers to the stability of the oscillator with respect to temperature and aging, and determines the channel spacing required to contain the modulated carrier signal. Conversely, for a given regulated channel spacing, the frequency stability determines the maximum data rate that can be supported without violating the channel boundary. Phase noise generally refers to the oscillator phase jitter resulting in a broadband component to the carrier signal which will extend into adjacent channels. If the phase noise is too high, this can corrupt the modulation source itself, and limit adjacent channel selectivity due to reciprocal mixing.

FIG. 1 illustrates the effect of reciprocal mixing to produce phase noise with a non-ideal oscillator. FIG. 1 shows a plot 100 of signal strength about a center carrier frequency $f_C$ (110), with a wanted channel region 120. Phase jitter in the oscillator frequency results in a component of the signal strength, identified by the plot region 130, in the adjacent channel region 140, creating phase noise as the channels mix.

A simple form of PLL synthesizer contains a voltage controlled oscillator (VCO) operating at the required carrier frequency, a frequency divider, which is a digital divider circuit, a phase detector circuit and a loop filter. FIG. 2 illustrates this type of simple conventional synthesizer 200. The synthesizer circuit 200 acts to lock the reference frequency ($f_{REF}$) to $f_{VCO}/N$, resulting in an output frequency (carrier) of $N \cdot f_{REF}$. The input reference frequency $f_{REF}$ is compared in a phase detector 220 to that of the divided down feedback from the output of a divider 245, as a result of the frequency produced by a VCO 240. The output of the phase detector 220 is filtered by a loop filter 230, which produces a voltage to control the VCO 240 frequency output $N \cdot f_{REF}$.

FIG. 3 illustrates a conventional single loop synthesizer circuit 250. By adding a further divider $N_R$ (255) to the synthesizer of FIG. 2, between the reference frequency source and the PLL, it is possible to synthesize a whole range of output frequencies with value: $n \cdot f_{REF}/n_R$. With the addition of a divide by $n_M$ prescaler 290, to the PLL circuit 250, an even wider range of output frequencies $f_{SYNTH}$ may be synthesized with value: $n_M \cdot n \cdot f_{REF}/n_R$.

FIG. 4 illustrates an exemplary synthesizer spectrum of signal strength vs. frequency. The plot 150 of the typical synthesizer spectrum has a center carrier frequency $f_C$ (160), with a loop bandwidth 170, formed by the VCO spectrum 180, the reference source spectrum 190, and the multiplied reference noise floor 195 (e.g., divide by N, 245 of FIG. 2).

Previous solutions, as shown in FIG. 3, for hard disk drive applications use a single PLL to generate the desired output frequency. To meet the small frequency step size, the reference frequency must be low, the multiplication factor must be high, and the loop bandwidth must be narrow. To meet the phase noise requirements however, the reference frequency must be high, the multiplication factor must be low, and the loop bandwidth must be wide. These conflicting requirements associated with frequency step size and phase noise limit the performance that can be obtained with a single PLL.

In one prior art solution, a two loop PLL uses a fine tune loop as a reference for a second loop that does a coarse frequency tuning. This technique, however, creates another problem, as the multiplication factor of the coarse tune loop multiplies the fine tune loop frequency step size, and therefore, increases the phase noise out of the fine tune loop, disadvantageously increases the reference sidebands, and makes full integration of the entire circuit on a single chip more difficult.

A more recent extension of the basic PLL based synthesizer is the fractional-N device. A fractional-N loop with a dual modulus prescaler can be used for a read channel to improve phase noise and frequency resolution. But, increasingly finer frequency resolution causes spurious signals to appear inside the loop bandwidth. For example, a 20 MHz reference signal with a loop bandwidth of 1 MHz can use a 0.25 fractional part without significant problems because the 5 MHz sideband caused by the fractional process is far enough beyond the loop bandwidth to get rejected. This results in a 5 MHz step size resolution, but does not reach the exemplary goal of 1 MHz frequency resolution or lower, as mentioned above.

For wireless applications, the phase noise requirement is so low that an external VCO is required in a fractional-N synthesizer. A fractional divide by N PLL is used to get small frequency steps, and a narrow bandwidth is used to filter out the spurious signals generated by the method. The fractional divide by N also puts spurious signals inside the loop bandwidth and sigma delta techniques are used in an attempt to eliminate the effects of the fractional spurs. Consequently, the fractional N technique has limited improvement usefulness.

Another conventional multi-loop synthesizer has a fine and coarse tune loop solution which uses a single sideband (SSB) mixer to combine the two signals produced. The prior art use of the SSB mixer is much more complicated and adds more mixing products that get multiplied by the N in the final PLL. The SSB mixer implementation has relatively high noise, high sidebands, narrow bandwidth, and may require 0 and 90 degree outputs from the VCO, which restricts the design possibilities.

Theoretically, a mixer will perform the mathematical multiplication of the two input signals, creating components positioned at frequencies equal to the sum and difference of the input signals and no additional components. For this to be the case, however, the mixing (multiplying) device must be perfectly linear and there must be no leakage on the input signals to the output port.

The term "balanced" in the double balanced mixer implies that neither of the input terms will appear at the mixer output. In practice, suppression of these input components is never perfect in an analog mixer circuit, (it may be virtually perfect in a digital implementation). A balanced mixer can be implemented using a transformer coupled diode arrangement (termed a passive mixer, which is however, not practical to implement on integrated circuit chips) or using an active transistor based design, the most well known of which is known as the Gilbert cell mixer.

FIG. 5 illustrates a typical CMOS Gilbert cell mixer circuit. The Gilbert cell mixer 300 of FIG. 5 mixes low frequency inputs (LO+/−) at 310, and RF frequency inputs (RF+/−) at 320 to produce an intermediate frequency output (IF+/−). The Gilbert cell mixer includes a balanced complimentary pair of (e.g., MOSFET) transistors at each input of the lower frequency LO inputs and the higher frequency RF inputs, to minimize the effect of any differential offset currents.

FIG. 6 illustrates the response of the signal strength vs. frequency of a non-ideal mixer. The plot 330 of FIG. 6 indicates the components of the input modulation frequency (fm) 340 and the carrier frequency (fc) 350, and the mixer sum (fc+fm) 370/375 and difference (fc−fm) 380/385 products at the odd harmonics of the carrier frequency (fc) 350 and (3fc) 390. Several of the common mixers produce signals at odd harmonics of the carrier frequency, particularly the diode ring mixer. Fortunately, the harmonics are easily filtered out by the low pass filter (LPF) used in the synthesizer PLL.

Thus, conventional synthesizer single loop systems have conflicting requirements which limit noise, step size and bandwidth performance for the applications considered. Conventional multi-loop synthesizers either produce an undesirable step size, increase the phase noise, or increase the sidebands.

Prior art use of an SSB mixer adds complicated circuitry, more mixing products, and multi-phase signals to be generated.

A fractional divide by N synthesizer can produce small frequency steps, but usually requires an external VCO because of the phase noise, and a narrow bandwidth filter for the spurious signals generated inside the loop bandwidth to eliminate the effects of the fractional spurs.

In addition, there is a need in the RF wireless and other hand held portable device applications to integrate the entire synthesizer and VCO on a single semiconductor chip, for size, power, manufacturing, and economic reasons.

Accordingly, there is a need for a synthesizer circuit for generating a high frequency in small frequency steps with low phase noise, in a small, low power solution, which is fully integrated on a semiconductor chip.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a low noise multi-loop radio frequency synthesizer for a local oscillator, for example. The multi-loop frequency synthesizer may be used in the local oscillator for the read channel in a hard disk drive and for RF wireless communications applications. Previous frequency synthesizers use single loops or complex multi-loop solutions to generate the desired output frequency and step size for a local oscillator. In the production of this high frequency, conventional synthesizers use a high multiplication of the original input reference signal, but as a byproduct, also detrimentally multiply the frequency step size, the phase noise, and generate spurious signals. This multiplication in the conventional synthesizer (both for its advantages and disadvantages), is done by the dividers in the PLL loops, and by the mixer in the final loop.

Consequently, the solution according to the present invention, is a multi-loop synthesizer with a unity multiplication factor translation loop which combines the fine tune loop with the coarse tune loop and does not multiply the frequency step size or the phase noise.

One exemplary advantage of the multi-loop synthesizer is that the requirements are divided between two loops and the translation loop, which combines the outputs of the two loops with a unity multiplication factor. The fine tune loop provides the small frequency step size, yet the phase noise of this loop does not significantly affect the final output. The coarse tune loop provides low phase noise performance without significantly affecting the frequency step size. The phase noise of the coarse tune loop inside the translation loop bandwidth dominates the other phase noise sources. The low multiplication factor and wide bandwidth allows phase noise to be minimized in the coarse tune loop.

A double balanced Gilbert cell is used in the translation loop which linearly combines the coarse and fine tune loops and filters out spurious signals. The mixer or digital sampler within the translation loop, generates the difference in translation loop VCO frequency and coarse tune frequency. The unity multiplication factor of the PLL minimizes any additional phase noise generated in the coarse and fine tune loops.

In the prior art, a much more complicated SSB mixer is used which adds more mixing products which are multiplied by the employed multiplication factor N in the final PLL. By using a double balanced Gilbert cell mixer, rather than an SSB mixer, 0 and 90 degree outputs from the VCO are avoided, and design possibilities are not restricted. A Gilbert cell mixer also has a broader bandwidth. In addition, by reducing the N in the final PLL loop to 1 gives a factor of N reduction in noise and reference sidebands.

In one exemplary aspect of the invention, by attaining the highest possible output frequency out of the coarse tune PLL, the effect of filtering the mixing products is enhanced and avoids locking to the wrong frequency. To achieve this highest possible frequency requires that there is no additional dividers or division after the coarse tune loop (e.g., divide by 1). By contrast, prior art solutions divide the output after the coarse tune loop, which wastes power and increases the mixing products in the following mixer, and makes it more difficult to select the correct mixer product.

Also, in the present invention both the fine tune and the coarse tune loops connect directly to the input reference signal. By contrast to prior art synthesizers, the present invention avoids the increase in the reference sidebands and noise produced when the output of the fine tune loop is cascaded into the coarse tune loop.

With the arrangement of the present invention, modulation of the synthesizer can be accomplished at the fine tune PLL and filtered by the translation loop. Conventionally, modulation was performed at the output of the final PLL, which is acceptable for low frequencies, but much more difficult in the RF and microwave ranges (e.g., 500–3000 MHz range).

In accordance with one aspect of the present invention a frequency synthesizer and a method of operating the same comprises a fine tune and a coarse tune PLL each with its own programmable division factor and coupled directly to an input reference signal, and a translation PLL with a unity division factor to operate as a linear translator. The division factors (frequency multipliers) are programmable, and a double balanced Gilbert cell mixer couples the fine and coarse tune PLLs together in the translation PLL. The divider and translation loop arrangement produces relatively high frequency output components which are easily filtered and produce low noise sidebands due to the low multiplication factors used. The mixer in the final translation PLL produces an output signal which is proportional to the linear sum of the fine and coarse tune output signals, while a loop filter in the translation loop filters out spurious signals, producing a low phase noise output which may be fully integrated on a semiconductor chip.

In another aspect of the present invention, a circuit and method for narrow band frequency modulation uses the fine tune loop for the input of the narrow band modulation signal, and the translation PLL for filtering the signal, providing broader bandwidths in the microwave frequency ranges.

Also in accordance with the invention, a circuit and method for the acquisition of lock for the translation loop and generation of a VCO sweep associated with the translation loop comprises two lock detectors for detecting the lock condition of the fine tune and the coarse tune PLLs, and logic circuitry for combining these conditions with the output state of an amplitude detection circuit of a mixing product detected within the translation loop. The output state of the lock condition logic is coupled to a VCO sweep circuit comprising a retriggerable one-shot for timing the charge and discharge of a ramp waveform generator, which forms a portion of the translation loop active filter circuit.

When lock is detected in the fine and coarse tune loops, the VCO sweep circuit is triggered and charges a capacitor in the ramp waveform generator portion of the translation loop active filter. Upon timeout of the one-shot, the ramp begins discharging, and coupled to the VCO, this tune voltage begins sweeping the VCO from the highest frequency downward. Once the upper sideband product frequency is in the bandwidth of the low pass filter, the PLL is steered into lock by the phase/frequency detector of the translation loop. In addition, the amplitude detector detects the presence of the upper sideband inside the LPF bandwidth and prevents any future sweeps by logically disabling any further input triggers to the one-shot.

Advantageously, by allowing the natural discharge of the integrating capacitor in the active loop filter to control the frequency sweep, switching discontinuities normally associated with switching transients when lock occurs are avoided. Other techniques that switch components in and out of the circuit at the lock point produce a transient that can cause the loop to lose lock.

Thus a low phase noise multi-loop RF synthesizer is disclosed, whose frequency can be programmed in fine steps, and frequency modulated to provide broad bandwidth into the microwave frequency range and which may be fully integrated on a semiconductor chip.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
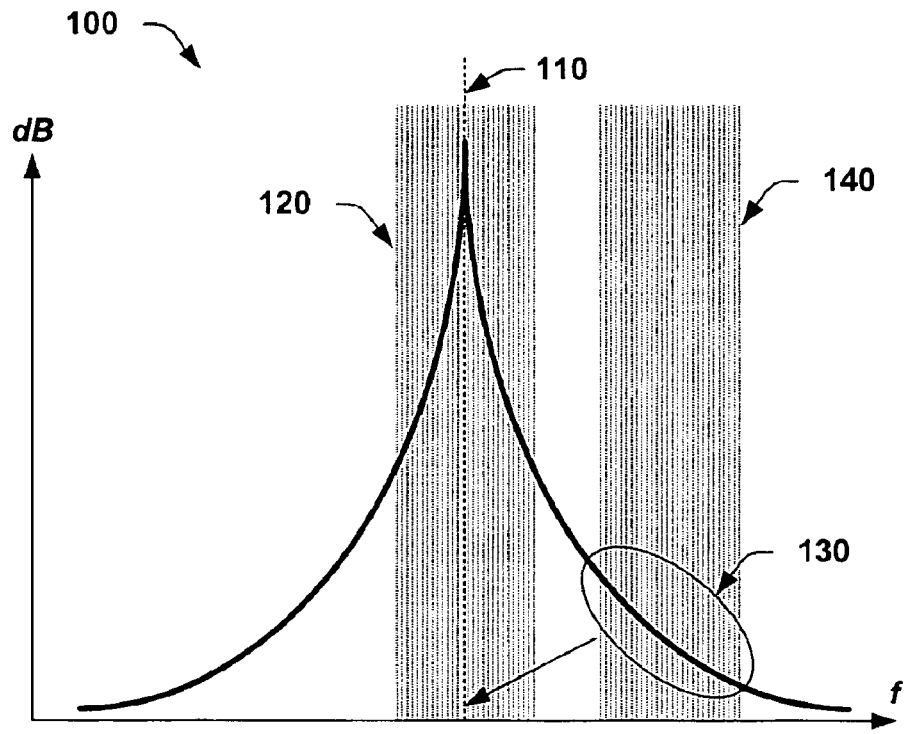
FIG. 1 is a plot of signal strength about a center carrier frequency $f_C$ illustrating the effect of reciprocal mixing to produce phase noise with a non-ideal oscillator.
Figure 2:
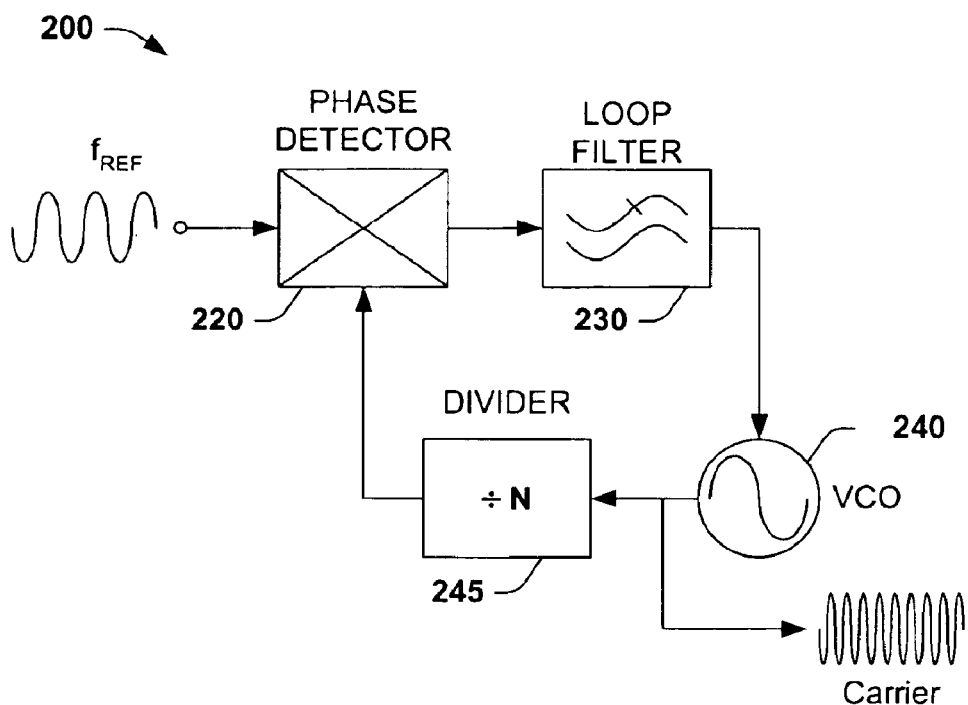
FIG. 2 is a simplified block diagram illustrating a simple conventional synthesizer which acts to lock a reference frequency ($f_{REF}$) to $f_{VCO}/N$, resulting in an output frequency (carrier) of $N \cdot f_{REF}$.
Figure 3:
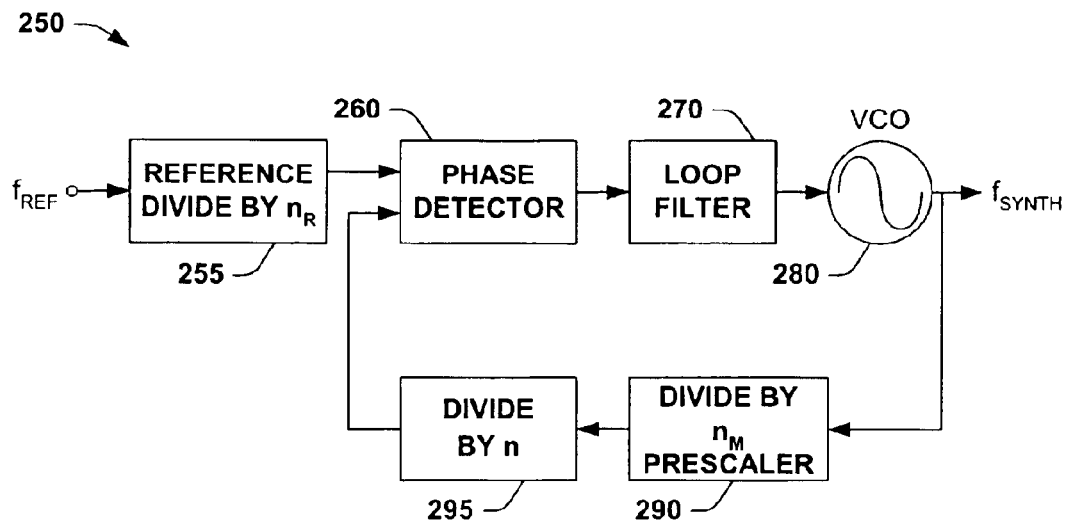
FIG. 3 is a simplified block diagram illustrating a conventional single loop synthesizer circuit similar to the circuit of FIG. 2, with an added divider $N_R$, and a divide by $n_M$ prescaler to synthesize a range of output frequencies $f_{SYNTH}$ with value: $n_M \cdot n \cdot f_{REF}/n_R$.
Figure 4:
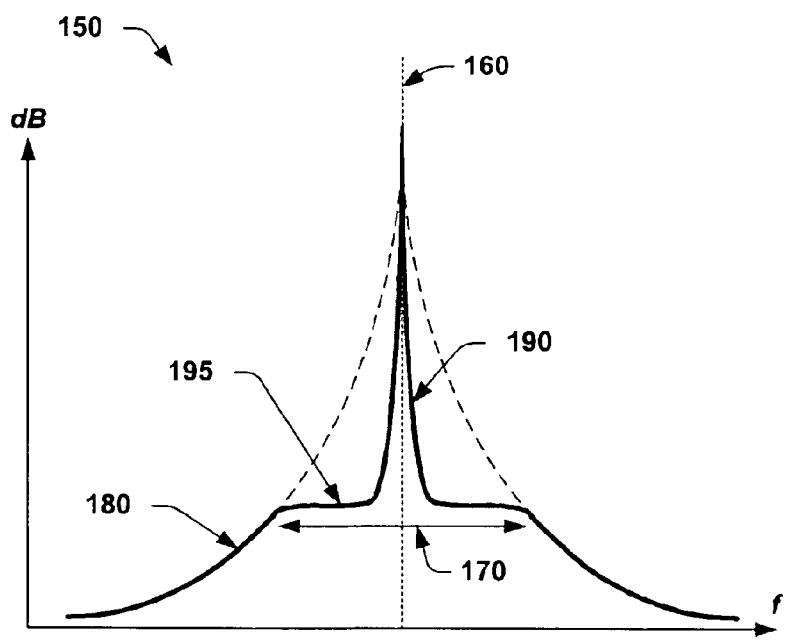
FIG. 4 is a plot of signal strength about a center carrier frequency $f_C$ illustrating a typical synthesizer spectrum of signal strength vs. frequency, and illustrating a loop bandwidth, the VCO spectrum, the reference source spectrum, and the multiplied reference noise floor.

The present invention will now be described with reference to the drawings, wherein like reference numerals are used to refer to like elements throughout. The present invention relates to an exemplary low phase noise multi-loop synthesizer for producing an RF frequency used, for example, as a local oscillator for a read channel in a hard disk drive and for RF wireless communications applications. The multi-loop synthesizer output frequency can be programmed in fine steps, and frequency modulated to provide broad bandwidth into the microwave frequency range and may be fully integrated along with an internal VCO on a semiconductor chip. The specific arrangement of three (3) PLL loops as well as components within the multi-loop synthesizer and the application of a translation loop, permits a particularly low phase noise RF output with a fine frequency step size in a small, low power solution.

Figure 7:
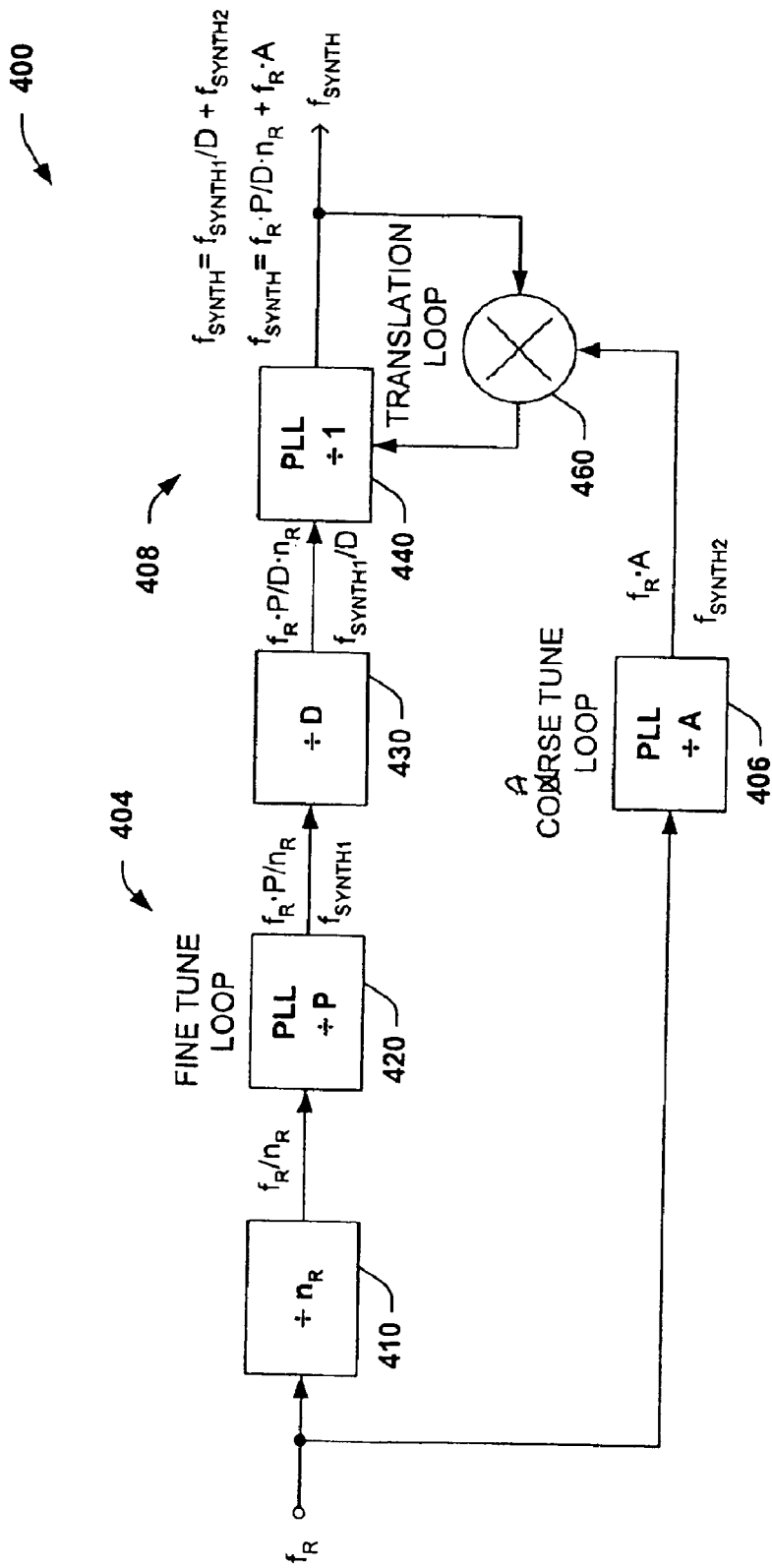
FIG. 7 is a simplified block diagram of an exemplary multi-loop synthesizer for producing an RF frequency, comprising a fine tune loop, a coarse tune loop, and a translation loop with a unity multiplication factor, to synthesize a range of output frequencies $f_{SYNTH}$ with value: $f_R \cdot P/D \cdot n_{R+} f_R \cdot A$ in which various aspects of the present invention may be carried out.

FIG. 7 shows an exemplary low phase noise multi-loop synthesizer according to the present invention, which is operable to synthesize a range of output frequencies $f_{SYNTH}$ with value: $f_R \cdot P/(D \cdot n_R) + f_R \cdot A$. The synthesizer block diagram 400 of the present invention receives an input reference signal with frequency $f_R$, which directly feeds both a fine tune loop branch 404 and a coarse tune loop 406. A signal having a lower frequency with fine frequency step sizes (fine frequency resolution) is produced by the fine tune loop 404, and a higher frequency signal (higher than $f_R$) with coarse step sizes is produced by the coarse tune loop 406. These two signals are then linearly summed in a translation loop 408 with no divider (e.g., represented as a divide by 1).

The synthesizer 400 employs a reference divider 410 in the fine tune loop branch 404 which receives the input reference signal and minimally divides down the reference $f_R$ by a factor $n_R$ to yield a signal having a frequency $f_R/n_R$. The reference divider 410 feeds this signal to a PLL acting as a fine tune loop 420, wherein the PLL further divides down the signal by a factor P to yield a fine tune loop frequency $f_{SYNTH1}$, where:

$$f_{SYNTH1} = f_R \cdot P/n_R$$

Note that although the nomenclature on the PLL indicates a "divide by" operation (and internal operations within the PLL include division operations), the feedback control system result of the internal divisions results in a multiplication of the input signal by the factor "P". Similarly, in other PLLs, such as the coarse tune loop PLL 406, the "divide by" nomenclature results in a multiplication of the respective input signal by the relevant factor indicated (e.g., factor "A").

Thus far, the fine tune loop frequency $f_{SYNTH1}$, is maintained at a high enough frequency to permit effective filtering of the signal, and minimal frequency multiplication to keep the phase noise to a minimum. The fine tune loop output $f_{SYNTH1}$, is then coupled to a divide by D divider 430, to lower the step size and frequency to:

$$f_{SYNTH1}/D = f_R \cdot P/(D \cdot n_R)$$

This output $f_{SYNTH1}/D$ of the fine tune loop branch 404 is then coupled into a translation loop 440, which has no divider to insure a linear combination (translation) of the fine tune and the coarse tune loop outputs. Also, the unity multiplication factor minimizes any additional phase noise generated in the coarse and fine tune loops. Advantageously, the relatively higher reference frequencies into each PLL permit easier filtering, resulting in significantly lower spurious outputs.

The present invention also receives the input reference signal $f_R$ directly into a PLL used as the coarse tune loop 406, which multiplies the reference signal $f_R$ by a factor A to yield a coarse tune loop frequency $f_{SYNTH2}$, where:

$$f_{SYNTH2} = f_R \cdot A$$

Figure 5:
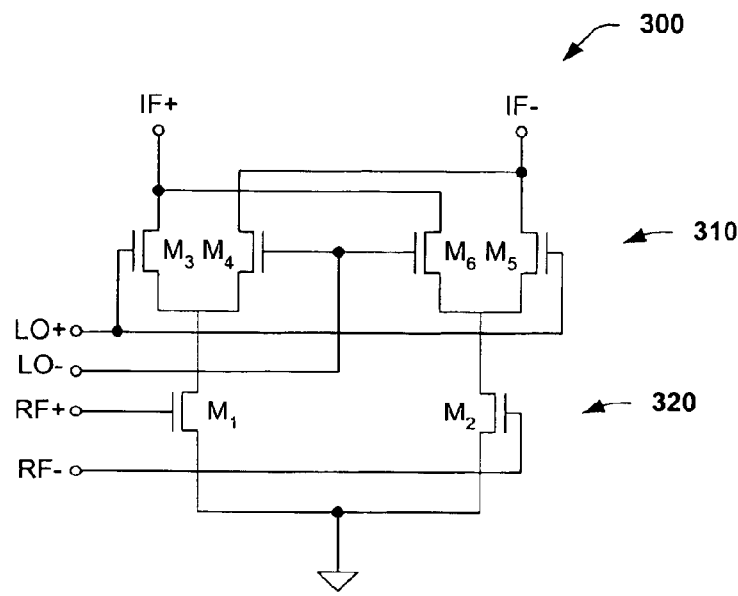
FIG. 5 is a simplified schematic diagram of a prior art CMOS Gilbert cell mixer circuit.
Figure 6:
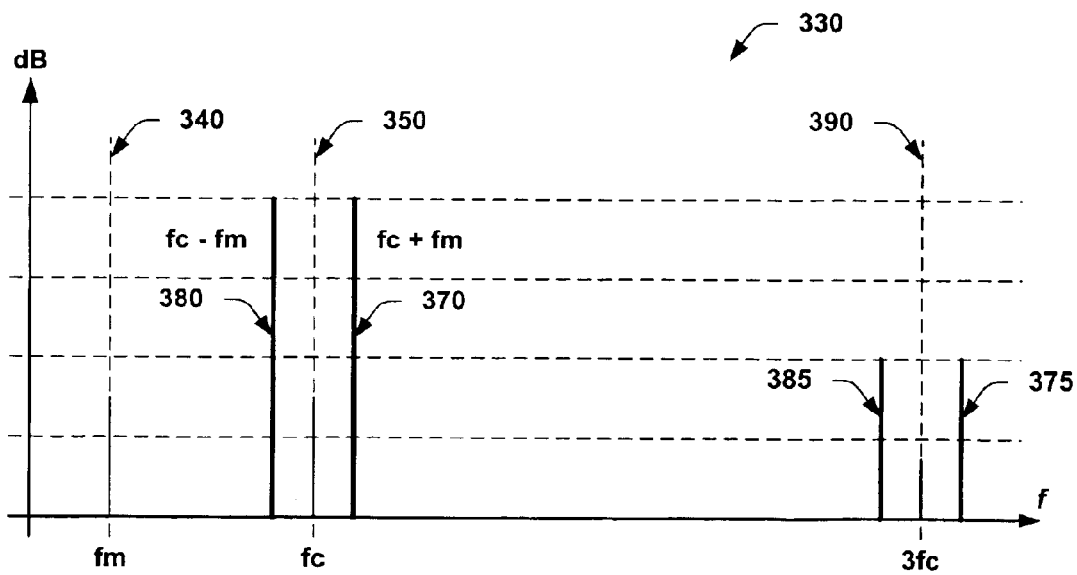
FIG. 6 is a plot of the response of the signal strength vs. frequency of a non-ideal mixer illustrating the components of the input modulation frequency (fm) and the carrier frequency (fc), and the mixer sum (fc+fm) and difference (fc−fm) products at the odd harmonics of the carrier frequency (fc) and (3fc)

Finally, a double balanced Gilbert cell mixer 460 (e.g., similar to FIG. 5) within the translation loop couples the coarse tune loop 406 to the fine tune loop branch 402 to linearly combine the output signals into a final synthesizer output $f_{SYNTH}$ where:

$$f_{SYNTH} = f_{SYNTH1}/D + f_{SYNTH2}$$

or:

$$f_{SYNTH} = f_R \cdot P/(D \cdot n_R) + f_R \cdot A$$

In contrast to other prior art synthesizers, by attaining the highest possible output frequency out of the coarse tune PLL, filtering of the mixing products after the mixer is optimal, and also avoids locking to the wrong frequency. To achieve this highest possible frequency requires that there are no additional dividers or division after the coarse tune loop (e.g., divide by 1). Another benefit of the arrangement of dividers is that dividing the output after the coarse tune loop wastes power and increases the mixing products in the following mixer, and makes it more difficult to select the correct mixer product. Yet another advantage of eliminating multipliers following the coarse tune loop, will come by way of presentation of measured phase noise figures to follow, that the coarse tune loop phase noise inside the translation loop bandwidth dominates all the other phase noise sources. Thus, this arrangement is advantageous by minimizing phase noise and for the other reasons mentioned.

Figure 8:
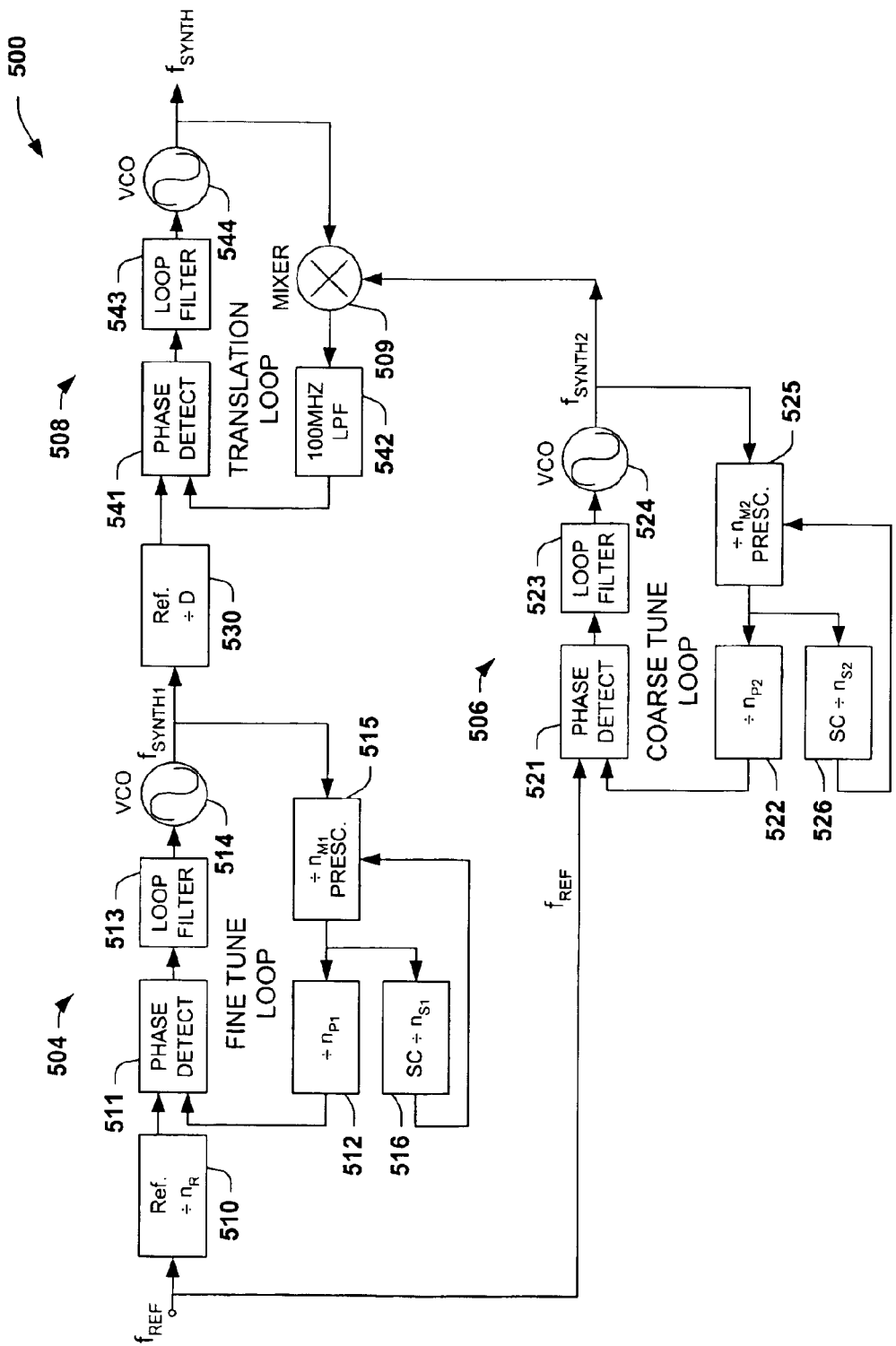
FIG. 8 is a block diagram of an exemplary multi-loop synthesizer for producing an RF frequency used, for example, in the local oscillator for the read channel in a hard disk drive and for RF wireless communications applications, in which various aspects of the present invention may be carried out.

FIG. 8 illustrates an exemplary multi-loop synthesizer for producing an RF frequency used, for example, in the local oscillator for a read channel in a hard disk drive and for RF wireless communications applications, according to the present invention. Similar to FIG. 7, this particular implementation of the synthesizer 500, has a fine tune loop 504, a coarse tune loop 506, and a translation loop 508 with a mixer 509 to couple the fine and coarse tune loops to produce a linear sum with an output frequency $f_{SYNTH}$.

A reference signal $f_{REF}$ (e.g., a crystal oscillator, running at about 20 MHz) is input to both the fine tune loop 504 and the coarse tune loop 506. Before entering the PLL of the fine tune loop, the reference signal $f_{REF}$ is minimally divided by $n_R$ in a divider 510. The output of the divider 510 is phase/frequency compared, by a phase detector 511, to the divided down VCO feedback in the fine tune PLL exiting a programmable divider 512 with an $n_{P1}$ multiplier. The output of the phase detector 511 of the fine tune loop 504 is coupled to a loop filter 513 (e.g., active or passive low pass filter) to produce a VCO tune voltage level proportional to the phase difference between the divided down $f_{REF}$ signal input and the divided down fine tune VCO feedback signal. The VCO tune voltage thus controls the frequency $f_{SYNTH1}$ of a VCO 514, which is fed back to a fine tune loop dual modulus prescaler 515 with an $n_{M1}$ or $n_M+1$ multiplier. The programmable dual modulus prescaler 515 works together with a swallow counter 516 with an $n_{S1}$ multiplier to permit programming of odd divide-by numbers, for example 5, which is then used as an input to the programmable divider 512. Together, the reference divider 510, and the fine tune loop 504 produces an output $f_{SYNTH1}$, where:

$$f_{SYNTH1}=(n_{M1} \cdot n_{P1}+n_{S1})f_{REF}/n_R=PX\, f_{REF}/n_R$$

The reference signal $f_{REF}$ is also directly input to a coarse tune loop 506 without a reference signal divider. The coarse tune loop 506 comprises the same arrangement as the fine tune loop 504, operating similarly, and comprising a phase detector 521, a programmable divider 522 with an $n_{P2}$ multiplier, a loop filter 523, a VCO 524, and a programmable dual modulus prescaler 525 with an $n_{M2}$ lower multiplier, which works together with a swallow counter 526 with an $n_{S2}$ multiplier. The coarse tune loop 506 produces an output $f_{SYNTH2}$, where:

$$f_{SYNTH2}=(n_{M2} \cdot n_{P2}+n_{S2})f_{REF}$$

A divide by D (e.g., 10–20) divider 530 after the fine tune loop VCO 514, divides the fine tune loop output frequency into smaller step sizes (frequency resolution) as desired, and, for example, minimizes the fine tune multiplication factor (e.g., 20–40), while reducing the phase noise of the fine tune loop (e.g., by 20 dB).

The output of the divide by D divider 530 is coupled to the final loop, the translation loop 508, which has no divider. The translation loop 508, has a double balanced Gilbert cell mixer 509, wherein a linear sum of the fine tune and the coarse tune loop outputs are combined. As the translation loop has no divider (e.g., represented as a divide by 1), the sum is therefore translated (in the frequency domain) to the output. A phase detector 541, compares the frequency difference output of the mixer 509 with the divided down output $f_{SYNTH1}$/D of the fine tune loop and generates an error signal that tunes the translation loop VCO to the correct frequency. A 100 MHz low pass filter 542 coupled to the output of the mixer 509 filters out spurious signals. The output of the phase detector 541 of the translation loop 508 is coupled to a loop filter 543 (e.g., active or passive low pass filter) to produce the VCO tune voltage. The VCO tune voltage thus controls the frequency of a VCO 544, which is fed back to the mixer 509 and also represents the final output $f_{SYNTH}$, where:

$$f_{SYNTH}=f_{SYNTH1}/D+f_{SYNTH2}$$

therefore:

$$f_{SYNTH}=((n_{M1} \cdot n_{P1}+n_{S1})f_{REF}/n_R)/D+(n_{M2} \cdot n_{P2}+n_{S2})f_{REF}$$

As stated earlier, the exemplary multi-loop synthesizer of the present invention, produces an RF frequency which may be used in the local oscillator for the read channel in a hard disk drive and for RF wireless communications applications. For these two particular applications two different frequencies are required, as well as step sizes, and a number of programmable divider values as follows, with:

$$f_{SYNTH1}=(n_{M1} \cdot n_{P1}+n_{S1})f_{REF}/n_R$$

$f_{SYNTH1}=P \cdot f_{REF}/n_R$ (where P=fine tune divide ratio steps of 1)

$$f_{SYNTH2}=(n_{M2} \cdot n_{P2}+n_{S2})f_{REF}$$

$f_{SYNTH2}=A \cdot f_{REF}$ (where A=coarse tune divide ratio steps of 1)

| Example Application: | HDD Read channel | RF Wireless |
|---|---|---|
| Reference frequency, $f_{REF}$ | 20 MHz | 20 MHz |
| fine tune divide ratio, P | 20–40 steps of 1 | 100–200 steps of 1 |
| $f_{SYNTH1}$ = P · $f_{REF}/n_R$ = | 200–400 MHz | 400–800 MHz |
| $f_{SYNTH1}$ step size = | 4 MHz | 4 MHz |
| Max. loop bandwidth = | 0.4 MHz | 0.4 MHz |
| Ref. divider, $n_R$ | 2 | 5 |
| mod. prescaler lower value, $n_{M1}$ | 4/5 | 4/5 |
| swallow div. integer value, $n_{S1}$ | 0–3 | 0–3 |
| progrm. div. integer value, $n_{P1}$ | 2–10 | 2–10 |
| coarse tune divide ratio, A | 8–23 steps of 1 | 54–62 steps of 1 |
| $f_{SYNTH2}$ = A · $f_{REF}$ = | 160–460 MHz | 1080–1240 MHz |
| $f_{SYNTH2}$ step size = | 20 MHz | 20 MHz |
| Max. loop bandwidth = | 2 MHz | 2 MHz |
| mod. prescaler lower value, $n_{M2}$ | 4/5 | 6/7 |
| swallow div. integer value, $n_{S2}$ | 0–3 | 0–5 |
| progrm. div. integer value, $n_{P2}$ | 2–10 | 9–11 |
| $f_{SYNTH}$ = $f_{SYNTH1}$/D + $f_{SYNTH2}$ | 180–500 MHz | 1100–1280 MHz |
| $f_{SYNTH}$ step size = | 1 MHz | 200 KHz |
| fine tune final divider, D | 10 | 20 |
| Max. loop bandwidth = | 2 MHz | 2 MHz |

In the first of the two examples above, the low noise multi-loop synthesizer block diagram 500 in FIG. 8 of the present invention, can provide low phase noise and fine frequency resolution for the time base generator in the read channel of a hard disk drive. This particular application of the synthesizer 500, has a fine tune loop 504, which produces 1 MHz steps, a coarse tune loop 506 which produces 20 Mhz steps, and a translation loop 508 which sums the fine and coarse loops together, permitting the circuits to be fully integrated on a single chip.

The fine tune loop 504 multiplies the 10 MHz reference $f_{REF}$ to 200–400 MHz in 10 MHz steps. A divide by D (e.g., divide by 10) 530 after the VCO 514 divides the fine tune loop 504 down to 20–40 MHz in 1 MHz steps. A 10 MHz reference to the phase detector 511, allows the fine tune loop to have a 1 MHz loop bandwidth without the effects of sampling delay. The divide by 10 (530) after the fine tune VCO 514 generates a 1 MHz frequency resolution, minimizes the fine tune multiplication factor (20–40), and reduces the phase noise of the fine tune loop by 20 dB. The 20 dB reduction in phase noise makes the contribution of phase noise to the output phase noise relatively insignificant.

The coarse tune loop 506 of this same example, multiplies the 20 MHz reference signal input $f_{REF}$ to 160–460 MHz in 20 MHz steps. A 20 MHz reference $f_{REF}$ input to the phase detector 521 allows the coarse tune loop to have a 2 MHz loop bandwidth without the effects of sampling delay. The phase noise of this loop inside the translation loop bandwidth dominates the other phase noise sources. The low multiplication factor and wide bandwidth (2 MHz) allows phase noise to be minimized in this loop.

The translation loop 508 linearly combines the signals of the coarse and fine tune loops and filters out spurious signals. The mixer 509 (e.g., or digital sampler) generates the difference in translation loop VCO frequency and coarse tune frequency. The phase detector 541 compares the frequency difference output of the mixer 509 with the divided down output of the fine tune loop 504 and generates an error signal that tunes the translation loop VCO via the loop filter 543 to the correct frequency. The unity multiplication factor minimizes any additional phase noise generated in the coarse and fine tune loops. The relatively high reference frequencies $f_{REF}$ of 20–40 MHz make filtering easier for low spurious outputs.

In the second of the two examples above, the low noise synthesizer block diagram 500 of the present invention can provide low phase noise and fine frequency resolution for an RF wireless application. The synthesizer 500 has a fine tune loop 504, which produces 200 KHz steps, a coarse tune loop 506 which produces 20 MHz steps, and a translation loop 508 which sums the fine and coarse loops together, permitting the circuits to be fully integrated on a single chip.

The fine tune loop 504 multiplies the 4 MHz reference $f_{REF}$ to 400–800 MHz in 4 MHz steps with a multiplication factor of 100–200. A divide by D (e.g., divide by 20) 530 after the VCO 514 divides the fine tune loop 504 down to 20–40 MHz in 200 KHz steps. A 4 MHz reference to the phase detector 511, allows the fine tune loop to have a 400 KHz loop bandwidth without the effects of sampling delay.

The coarse tune loop 506 of this same example, multiplies (in 57–62 steps) the 20 MHz reference signal input $f_{REF}$ to 1120–1240 MHz in 20 MHz steps. A 20 MHz reference $f_{REF}$ input to the phase detector 521 allows the coarse tune loop to have a 2 MHz loop bandwidth without the effects of sampling delay.

Finally, the translation loop 508 linearly combines the coarse and fine tune loop and filters out spurious signals. By contrast to a prior art synthesizer solution which cascades the fine tune loop into the coarse tune loop, the translation loop of the present invention combines the fine tune loop with the coarse tune loop to avoid multiplying the frequency step size or the phase noise. Also, the separate coarse tune loop provides low phase noise performance without significantly affecting the frequency step size.

Figure 9:
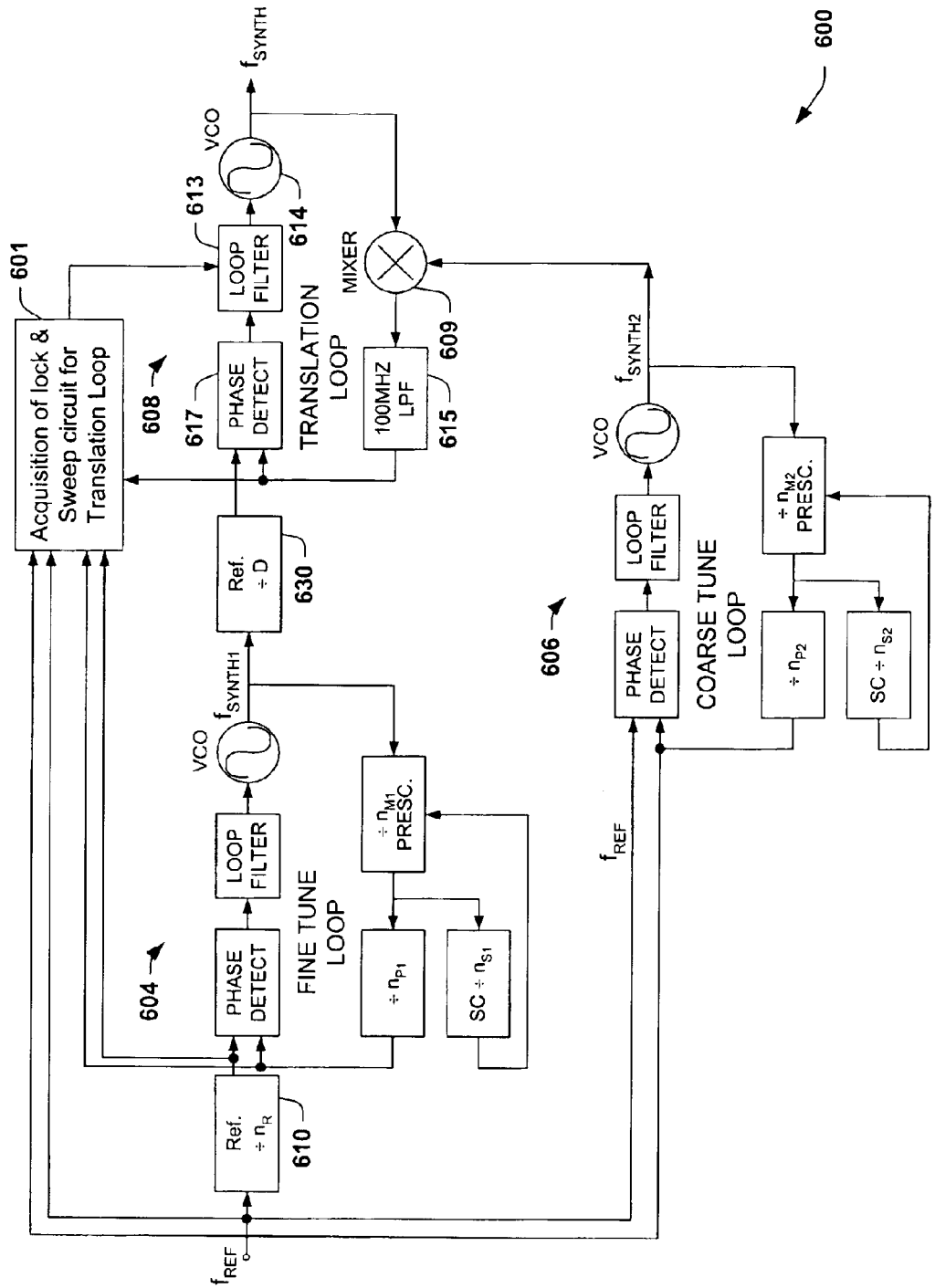
FIG. 9 is a block diagram of an exemplary multi-loop synthesizer of FIG. 8, combined with an acquisition of a lock and sweep circuit for the translation loop according to another aspect of the present invention.

FIG. 9 illustrates an alternate implementation of a multi-loop synthesizer 600 according to the present invention, wherein the exemplary multi-loop synthesizer 500 of FIG. 8, is combined with an acquisition of lock and sweep circuit 601 for the translation loop. The acquisition of lock and sweep circuit 601 of the synthesizer 600, comprises circuitry for detecting a lock condition in both the fine tune loop 604 and the coarse tune loop 606, and detecting within the translation loop 608 the upper sideband mixing product of the mixer 609.

When both fine and coarse tune loops (604 & 606) are locked, the translation loop acquisition circuit 601 is enabled, initiating a VCO sweep of the translation loop 608 via the loop filter 613. The sweep continues to ramp the VCO 614 downward from a higher frequency until the upper sideband mixing product is detected at the output of a 100 MHz low pass filter 615. Once this sideband is in the bandwidth of the low pass filter, the phase/frequency detector (PFD) 617 will produce a voltage based on the phase difference and steer the loop to lock. In addition, an amplitude detector within the acquisition of lock and sweep circuit 601 detects the presence of the upper sideband inside the LPF bandwidth and logically disables the circuit from further VCO sweeps.

The synthesizer 600 comprises all the advantages of the multi-loop synthesizer 500, with the additional features of lock acquisition detection and translation loop sweep control, while also providing a means of alarming peripheral circuits of loss of lock.

Figure 10:
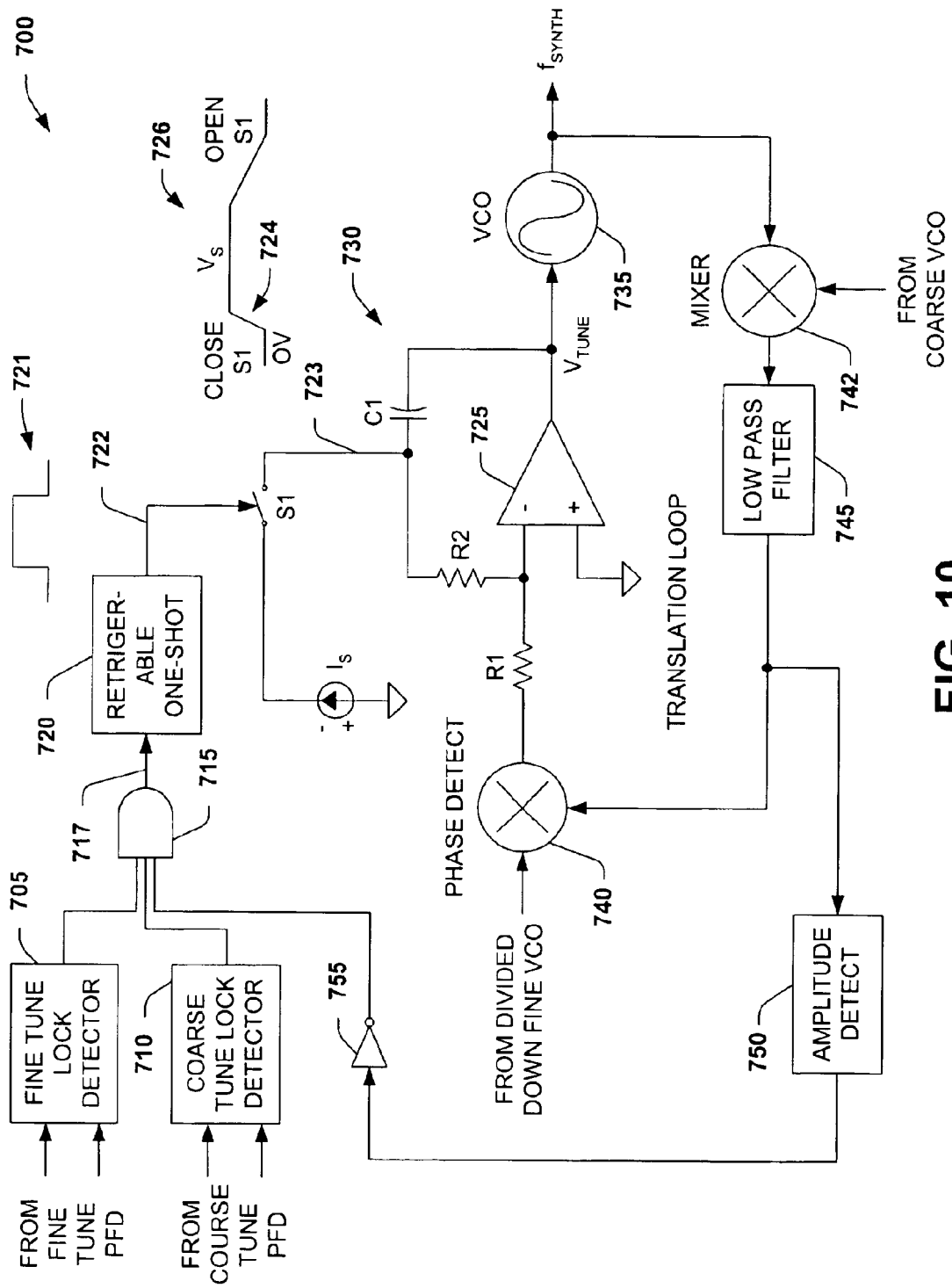
FIG. 10 is a block diagram of an exemplary acquisition of lock and sweep circuit for the translation loop of FIG. 9, according to another aspect of the present invention in which various aspects of the present invention may be carried out.

FIG. 10 illustrates an exemplary acquisition of lock and sweep circuit 700 for the translation loop of FIG. 9 (e.g., corresponding to circuit 601 of FIG. 9), according to another aspect of the present invention. The acquisition of lock and sweep circuit 700 has a fine tune lock detector 705, and a coarse tune lock detector 710 which are coupled to the inputs of the corresponding loop phase detectors. The fine and coarse tune loops lock first because of the frequency discrimination in the phase/frequency detector (PFD) for each loop, so no lock acquisition is needed for these loops. A zero output from the mixer (609 of FIG. 9), in the translation loop from the out-of-band VCO and coarse tune loop inputs produce a 0 volt output of the PFD. A PFD output voltage of 0 volts does not sweep the VCO frequency. When both loops are locked, an AND gate 715 of the translation loop acquisition circuit is enabled to produce a logic output state 717, causing a retriggerable one shot 720 to produce a pulse 721 (e.g., 10–100 us pulse width).

The rising edge of the one shot pulse 721 is coupled via 722 to close a switch S1, and charges a capacitor C1, via current a source $I_S$ and 723, to the supply voltage $V_{SUPPLY}$ at a rate 724 faster than the translation loop can lock to. In the exemplary acquisition of lock and sweep circuit 700, R1, R2, C1, and amplifier 725 comprise an active loop filter 730 (or 613 of FIG. 9), which produces a voltage $V_{TUNE}$ ramp waveform 726 to adjust the frequency of the VCO 735 based on the frequency difference detected by the phase detector 740. In this way, the VCO 735 starts at its highest output frequency, to insure that the lower sideband mixing product, which is another possible lock condition, is avoided. The falling edge of the one shot pulse 721 opens switch S1. The 0 volt output voltage from the PFD discharges the capacitor C1, ramping the $V_{TUNE}$ tune voltage 726 lower and sweeps the VCO output frequency to a lower value.

The sweep continues to ramp the VCO 735 downward from a higher frequency until the upper sideband mixing product from the Gilbert cell mixer 742, is detected at the output of a 100 MHz low pass filter (LPF) 745. The upper sideband product of the mixing operation occurs first in the frequency sweep down from maximum VCO output frequency. Once this sideband is in the bandwidth of the low pass filter 745, clock edges are generated to the input of the PFD 740, whereby the PFD produces an output voltage based on the frequency difference and steers the loop to lock. In addition, an amplitude detector 750 within the acquisition of lock and sweep circuit 700, detects the presence of the upper sideband inside the LPF bandwidth and prevents any further sweeps by logically disabling any further input triggers to the one shot 720 with an inverter 755 and the AND gate 715.

Advantageously, by allowing the natural discharge of the integrating capacitor C1 in the active loop filter 730 to control the frequency sweep, switching discontinuities normally associated with switching transients when lock occurs are avoided. Other techniques that switch components in and out of the circuit at the lock point produce a transient that can cause the loop to lose lock and thus preferably are not utilized.

Figure 11:
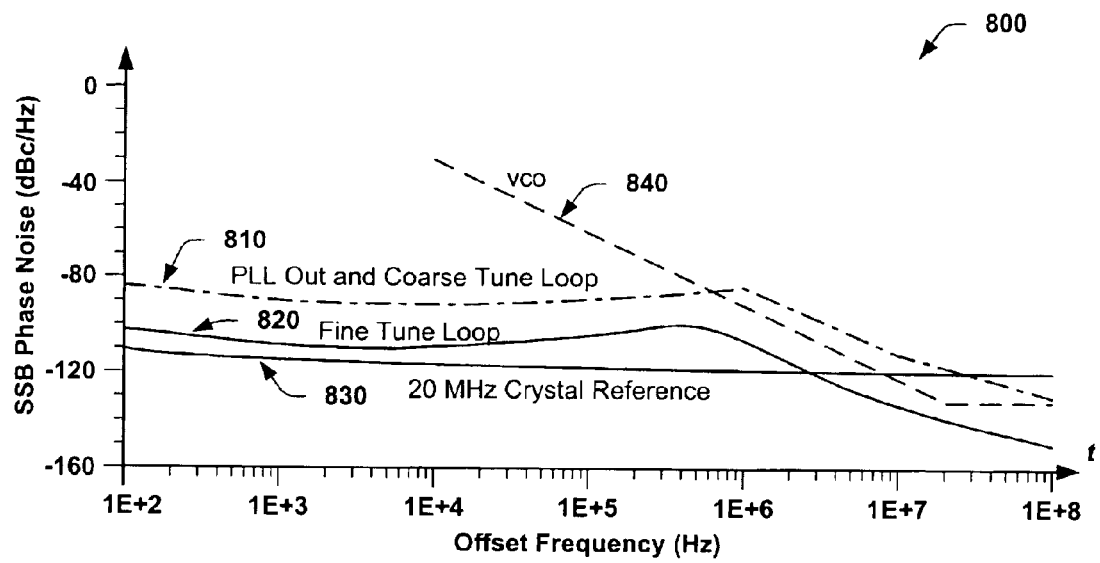
FIG. 11 is a plot of the phase noise of several of the signals of an exemplary multi-loop synthesizer over a range of frequencies, and illustrating that the coarse tune loop dominates the fine tune loop phase noise, according to an aspect of the present invention.

FIG. 11 is a plot 800 of the phase noise of several of the signals of an exemplary multi-loop synthesizer over a range of frequencies for the read channel of a hard disk drive, according to an aspect of the present invention. Note that the SSB Phase noise axis in FIG. 11 is measured in dBc/Hz which is the ratio of the measured signal strength relative to that of the carrier in a 1 Hz bandwidth, while the Offset frequency is the FM noise modulation frequency in Hz offset from the carrier center frequency. Plot 800 illustrates that the coarse tune loop phase noise 810 dominates the fine tune loop phase noise 820, as well as the crystal reference (e.g., 20 MHz) 830, and the higher frequency end of the typical unlocked VCO without controls 840. The fine tune loop phase noise is 10–20 dB below the phase noise of the coarse tune loop. Consequently, this figure shows the coarse loop phase noise approximately equals the output of the complete multi-loop synthesizer. This fact also points out why it is important to minimize the multiplication factors in and after the coarse tune loop.

Figure 12:
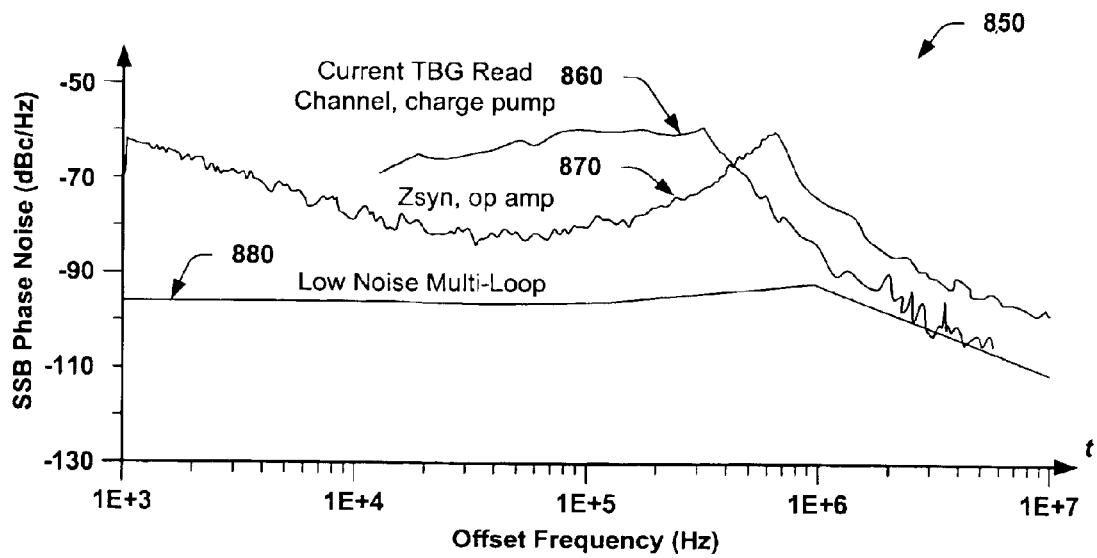
FIG. 12 is a plot of a comparison of measured phase noise data for the current time base generator for the read channel and of the zero pin synthesizer and of an exemplary multi-loop synthesizer over a range of frequencies, according to an aspect of the present invention.

FIG. 12 is a comparison plot 850 of the phase noise of several synthesizer techniques and of an exemplary low noise multi-loop synthesizer, according to an aspect of the present invention over a range of frequencies for the read channel of a hard disk drive. Illustrated is the current time base generator 860, the zero pin synthesizer 870 and the exemplary low noise multi-loop synthesizer 880. Clearly, the exemplary low noise multi-loop synthesizer 880 of the present invention applied to an HDD read channel demonstrates a significant improvement in phase noise. The measured phase noise of the exemplary multi-loop synthesizer 880 is 15 dB lower than the phase noise of the zero pin synthesizer using an operational amplifier filter 870, and 30 dB lower than the phase noise of the current time base generator using a charge pump 860.

Figure 13:
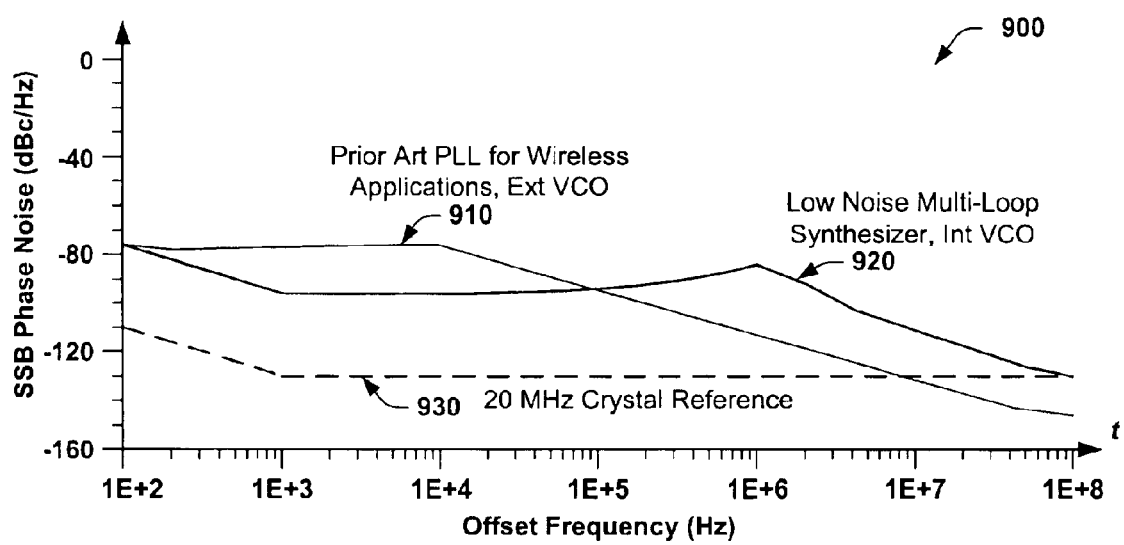
FIG. 13 is a plot of a comparison of measured phase noise data for a PLL for GSM Wireless applications with an external VCO and of an exemplary multi-loop synthesizer with an internal VCO over a range of frequencies, according to an aspect of the present invention.

FIG. 13 is a comparison plot 900 of the phase noise of a prior art synthesizer and of an exemplary low noise multi-loop synthesizer, according to an aspect of the present invention over a range of frequencies for an RF wireless application. Plot 900 illustrates the measured phase noise data for a prior art National Semiconductor PLL for GSM wireless applications with an external VCO 910, an exemplary multi-loop synthesizer with an internal low Q ring VCO 920, and a crystal reference signal input (e.g., 20 MHz) 930. The low noise multi-loop synthesizer has 15 dB lower noise than the National PLL for offset frequencies between 1–100 KHz. For offsets greater than 400 KHz the external VCO with the National PLL has 20 dB lower phase noise. However, recent advances in monolithic LC oscillators in this band have also reduced the phase noise.

The advantage for wireless applications is that the external VCO can be eliminated. Elimination of the external VCO lowers noise, allows wider bandwidth solutions of the loop, speeds the settling time of the loop when the frequency is changed, creates a closer to ideal synthesizer, and is a great cost savings to synthesizer customers and manufacturers, while providing a valuable marketing tool. Furthermore, this solution reduces phase noise requirements of the IC VCO because of the wider loop bandwidth and lower "close in" phase noise.

Previous frequency synthesizers use single loops or complex multi-loop solutions to generate the desired output frequency and step size for a local oscillator. In the production of this high frequency, conventional synthesizers use a high multiplication of the original input reference signal, but as a byproduct also detrimentally multiply the frequency step size, the phase noise, and generate spurious signals. This multiplication in the conventional synthesizer (both for its advantages and disadvantages), is done by the dividers in the PLL loops, and by the mixer in the final loop.

Thus, the present invention provides a low noise multi-loop radio frequency synthesizer for a local oscillator used in the local oscillator for the read channel of a hard disk drive and for RF wireless communications applications. The multi-loop synthesizer of the present invention comprises a unity multiplication factor translation loop which combines the outputs of a fine tune loop with a coarse tune loop without multiplying the frequency step size or the phase noise problems which are common in prior art synthesizers.

The fine tune loop provides the small frequency step size, yet the phase noise of this loop does not significantly affect the final output. The coarse tune loop provides low phase noise performance without significantly affecting the frequency step size. The phase noise of the coarse tune loop inside the translation loop bandwidth dominates the other phase noise sources. The low multiplication factor and wide bandwidth allows phase noise to be minimized in this loop.

According to an aspect of the present invention, the translation loop uses a double balanced Gilbert cell to linearly combine the coarse and fine tune loop outputs and filter out spurious signals. The mixer or digital sampler within the translation loop generates the difference in translation loop VCO frequency and coarse tune frequency. The unity multiplication factor of the PLL also minimizes any additional phase noise generated in the coarse and fine tune loops.

In at least one prior art technique, a much more complicated SSB mixer is used which adds more mixing products which are multiplied by the N in the final PLL. By using a double balanced Gilbert cell mixer, rather than an SSB mixer, 0 and 90 degree outputs from the VCO are avoided, and design possibilities are not restricted. A Gilbert cell mixer also has a broader bandwidth. By reducing the N in the final PLL loop to 1 gives a factor of N reduction in noise and reference sidebands.

The present invention seeks to attain the highest possible output frequency out of the coarse tune PLL to enhance the effect of filtering of the mixing products and avoid locking to the wrong frequency. To achieve this highest possible frequency requires that there is no additional dividers or division after the coarse tune loop (e.g., divide by 1). By contrast a prior art technique divides the output after the coarse tune loop, which wastes power and increases the mixing products in the following mixer, and makes it more difficult to select the correct mixer product.

Also, in the present invention, both the fine tune and the coarse tune loops connect directly to the input reference signal. By contrast to prior art synthesizers, the present invention avoids the increase in the reference sidebands and noise produced, when the output of the fine tune loop is cascaded into the coarse tune loop.

According to one aspect of the present invention, modulation of the synthesizer can now be done at the fine tune PLL and filtered by the translation loop. Conventionally, modulation is done at the output of the final PLL, which is acceptable for low frequencies, but much more difficult in the RF and microwave ranges (e.g., 500–3000 MHz range).

Even though circuitry has been used as a solution for the multi-loop synthesizer in this example, it will be apparent to those skilled in the art, that firmware or a high speed software program, may also be used to implement the present invention.

A low noise multi-loop synthesizer circuit of the present invention, comprises a unity multiplication factor translation loop which combines the outputs of a fine tune loop with a coarse tune loop without multiplying the frequency step size or the phase noise for producing an RF frequency used as the local oscillator for the read channel in a hard disk drive and for RF wireless communications applications. The multi-loop synthesizer output frequency can be programmed in fine steps, and frequency modulated to provide broad bandwidth into the microwave frequency range and may be fully integrated along with an internal VCO on a semiconductor chip. The specific arrangement of three PLL loops, as well as components within the multi-loop synthesizer and the application of a translation loop, permits a particularly low phase noise RF output with a fine frequency step size in a small, low power solution. The methodology and architecture used to achieve these goals provide a significant improvement in performance over the prior art.

Another aspect of the present invention provides a methodology for low noise multi-loop synthesizer circuit operation of fine and coarse frequency generation, phase locking and lock detection for applications (e.g., the read channel of a HDD, and RF wireless telecommunications) and the manufacture of such devices illustrated and described herein, as well as with other such devices.

Figure 14:
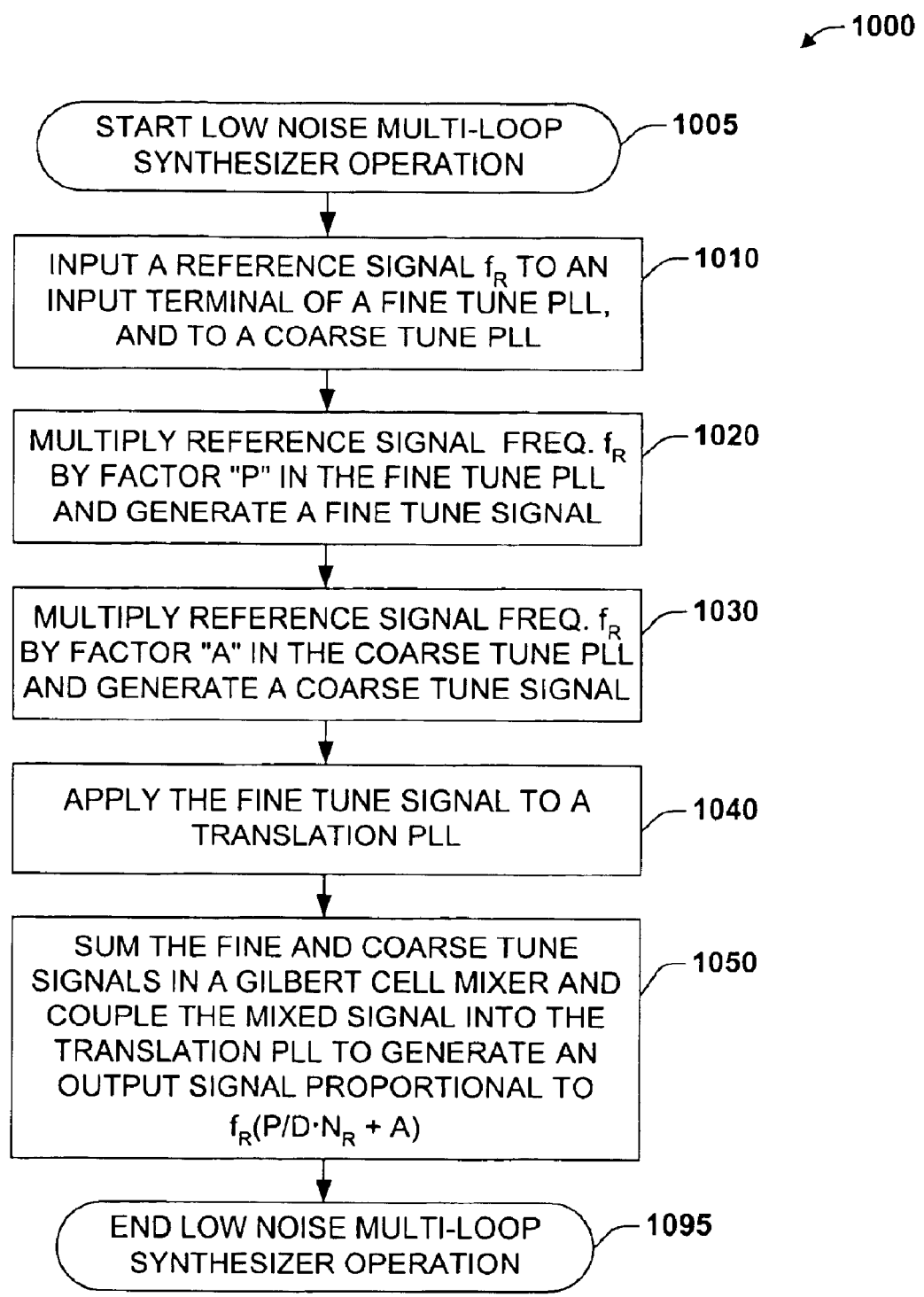
FIG. 14 is a flow diagram illustrating an exemplary method for multi-loop synthesizer circuit operation in association with an aspect of the present invention.

Referring now to FIG. 14, an exemplary method 1000 is illustrated for low noise multi-loop synthesizer operation in association with an aspect of the present invention. While the exemplary method 1000 is illustrated and described herein as a series of acts or events, it will be appreciated that the present invention is not limited by the illustrated ordering of such acts or events, as some acts or events may occur in different orders and/or concurrently with other acts or events apart from that shown and described herein, in accordance with the invention. In addition, not all illustrated acts or events may be required to implement a methodology in accordance with the present invention. Moreover, it will be appreciated that the method 1000 may be implemented in association with the apparatus and systems illustrated and described herein as well as in association with other systems not illustrated.

The method 1000 comprises detection of a low noise multi-loop synthesizer, wherein the synthesizer circuit combines three phase lock loops for producing a low power, low phase noise RF frequency used as the local oscillator for the read channel in a hard disk drive and for RF wireless communications applications, wherein the synthesizer output frequency can be programmed in fine steps, and frequency modulated to provide broad bandwidth into the microwave frequency range and may be fully integrated along with an internal VCO on a semiconductor chip A reference clock is input to a fine tune PLL circuit which multiplies the reference frequency by a factor "P" and a coarse tune PLL circuit which multiplies the reference frequency by a factor "A". The fine tune and coarse tune PLL circuits generate a fine tune signal and a coarse tune signal respectively. The fine tune signal is applied to a unity multiplication factor translation loop which has a Gilbert cell double balanced mixer. The mixer linearly sums the coarse tune signal and a divided down output of the fine tune signal in the translation loop to generate an output signal having a higher frequency and proportional to $f_R(P/D \cdot N_R + A)$.

Optionally, an additional acquisition of lock and sweep circuitry may be employed to detect when both the fine and coarse tune PLLs have detected lock and initiate a sweep of the translation loop VCO which locks at the upper sideband mixing product. For example, the inputs to the fine and coarse tune loop phase/frequency detectors are also coupled to fine and coarse tune lock detectors. The outputs of the fine and coarse tune lock detectors are ANDed together in an AND logic circuit to determine if both of the loops have achieved lock. When this condition is indicated, a one-shot circuit is triggered to generate a pulse to initiate a sweep circuit associated with a translation loop VCO. With the sweep circuit initiated, a ramp waveform is generated within an active loop filter of the translation loop. The ramp waveform applied to the translation loop VCO, begins sweeping the VCO frequency from a maximum frequency downward. When the VCO frequency has swept down to the upper sideband mixing product, an amplitude detect circuit detects the translation loop condition, the one-shot is disabled from further initiation and the sweep is discontinued.

The low noise multi-loop synthesizer operation method begins at 1005. At 1010 a reference signal $f_R$ is input to a fine tune PLL and to a coarse tune PLL circuit. At 1020 the fine tune PLL multiplies the reference frequency by a factor "P" to generate a fine tune signal. At 1030 the coarse tune PLL multiplies the reference frequency by a factor "A" to generate a coarse tune signal. The fine tune signal output of the fine tune PLL is applied to a translation loop at 1040. The fine tune signal and the coarse tune signal is summed at 1050, in a Gilbert cell mixer of a translation loop PLL to generate an output proportion to $f_R(P/D \cdot N_R + A)$.

Thereafter the low noise multi-loop synthesizer operation ends at 1095, and the method 1000 may be repeated for subsequent synthesizer operations of a communications device.

Optionally, at 1010, a narrow band modulation of the RF output may be accomplished with by adding a modulation signal to the fine tune loop.

Figure 15:
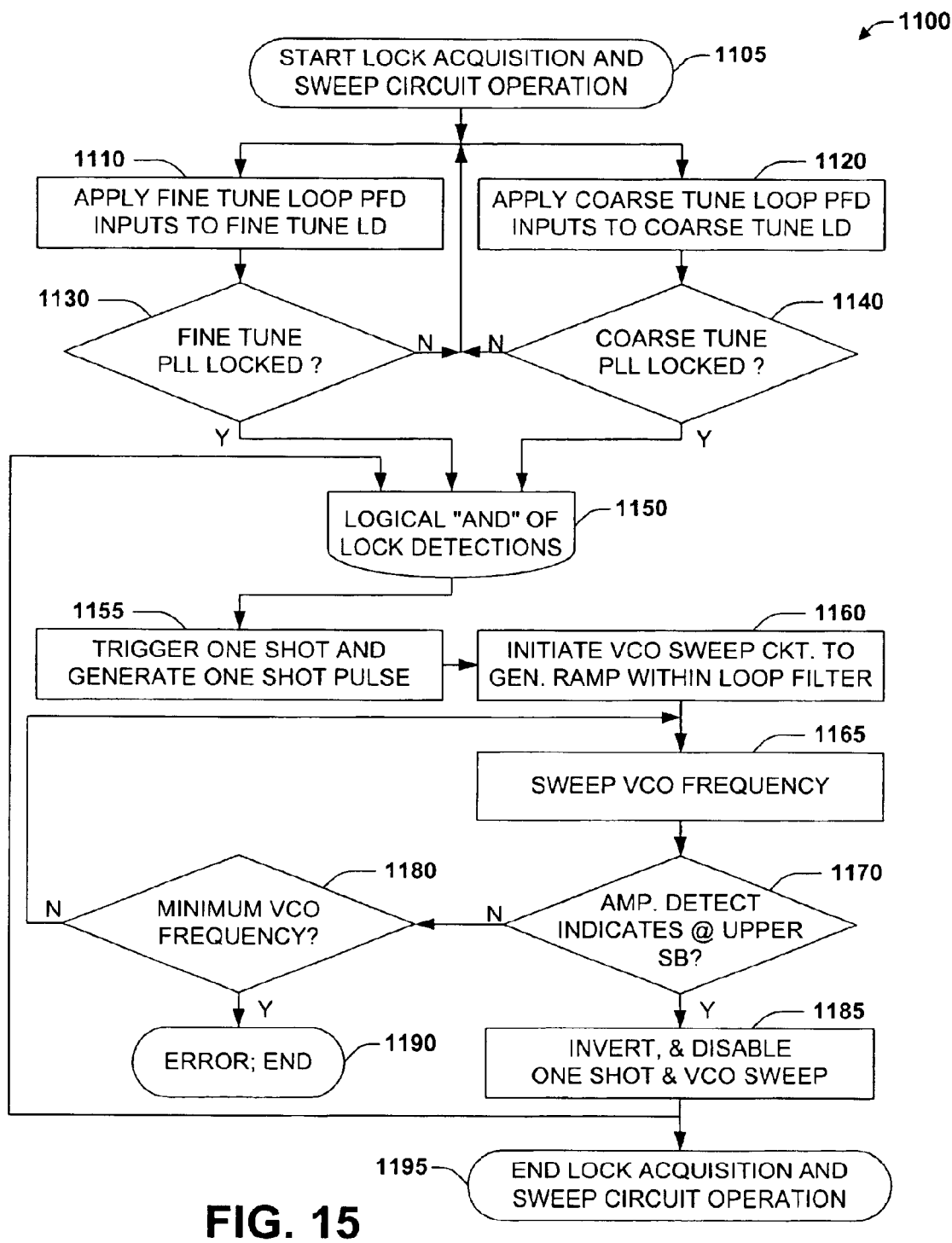
FIG. 15 is a flow diagram illustrating an exemplary method for an optional acquisition of lock and sweep circuit operation of the multi-loop synthesizer operation of FIG. 14 in association with an aspect of the present invention.

FIG. 15 is a flow diagram illustrating an exemplary method 1100 for an optional acquisition of lock and sweep circuit operation of the multi-loop synthesizer operation method 1000 of FIG. 14 in association with an aspect of the present invention. The acquisition of lock and sweep circuit operation 1100, hereinafter begins at 1105.

The inputs to the phase/frequency detectors (PFDs) within the fine tune and coarse tune loops, are fed into corresponding fine tune and coarse tune lock detectors (LDs) at 1110 and 1120. A determination is made by the fine tune LD at 1130, and by the coarse tune LD at 1140 when lock has been acquired. If a lock condition has not been achieved, the inputting and lock determination operations repeat back to 1110 and 1120 for the fine or coarse tune LD respectively. Otherwise, a logical AND at 1150 determines when both the fine and coarse tune LDs have achieved a lock condition. With both the fine tune and coarse tune LDs indicating a lock condition output of the AND gate, a one shot is triggered at 1155 to generate a pulse. The one shot pulse initiates a sweep circuit associated with an active loop filter and a VCO of the translation loop, to generate a ramp waveform at 1160.

At 1165, the ramp waveform is coupled into the VCO of the translation loop producing a frequency sweep down from the maximum VCO frequency. The translation loop frequency continues sweeping downward until, at 1170 a determination is made whether the upper sideband mixing product frequency has been achieved and locked. If the upper sideband frequency has not been reached at 1170, as indicated by an amplitude detector on the translation loop low pass filter, a check is made as to whether the minimum VCO frequency has been reached at 1180. Otherwise, if at 1170, the upper sideband frequency has been achieved, the amplitude detector output is inverted at 1185, and disables the one shot via the AND gate at 1150 from further triggers and stops the VCO sweep. If the minimum frequency has not been achieved, at 1180, then the method continues back to 1165 to continue sweeping the VCO. Otherwise, if at 1180, the minimum frequency has been reached, an error is indicated and the operation ends at 1190.

Thereafter the lock acquisition and sweep circuit operation of the multi-loop synthesizer operation ends at 1195, and the method 1100 may be repeated for subsequent lock acquisition and sweep circuit operations of a synthesizer used in local oscillator applications.

The methodology 1100 thus provides for a low noise multi-loop synthesizer circuit to produce an RF frequency which may be programmed in fine frequency steps for producing an RF frequency used as the local oscillator for the read channel in a hard disk drive and for RF wireless communications applications. The low noise multi-loop synthesizer circuit of the present invention, comprises a unity multiplication factor translation loop which linearly sums a fine tune loop signal and a coarse tune loop signal by the use of a Gilbert cell double balanced mixer, without multiplying the frequency step size or the phase noise. The multi-loop synthesizer output frequency can be programmed in fine steps, and frequency modulated to provide broad bandwidth into the microwave frequency range and may be fully integrated along with an internal VCO on a semiconductor chip. The specific arrangement of three PLL loops, as well as components within the multi-loop synthesizer and the application of a translation loop, permits a particularly low phase noise RF output with a fine frequency step size in a small, low power solution. The methodology and architecture used to achieve these goals provide a significant improvement in performance over prior art.

Other variants of methodologies may be provided in accordance with the present invention, whereby low noise multi-loop synthesizer circuit operation is accomplished employing fine tune and coarse tune loops which are directly fed by the reference signal, a unity multiplication translation loop which comprises a Gilbert cell double balanced mixer, in a low power device which permits full integration on a single chip with an internal VCO.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A multi-loop frequency synthesizer, comprising:
   an input terminal for receiving an input reference signal having a frequency $f_R$;
   a fine tune phase locked loop coupled to the input terminal and driven by the input reference signal to output a fine tune signal having a frequency $f_R \cdot P$, where P is an integer;
   a coarse tune phase locked loop coupled to the input terminal and driven by the input reference signal to output a coarse tune signal having a frequency $f_R \cdot A$, where A is an integer; and
   a translation phase locked loop having a unity multiplication factor driven by the fine tune signal; comprising a Gilbert cell double balanced mixer coupled between the coarse tune and the translation phase locked loops, the Gilbert cell mixer combining the coarse tune signal and a divided down output signal of the fine tune phase locked loop and coupling the mixed signal into the translation phase locked loop to generate an output signal with a frequency which is proportional to the linear sum of the coarse tune signal and the fine tune signal, the low multiplication factor and high bandwidth of the coarse tune loop and the unity multiplication factor of the translation loop reducing the phase noise of the frequency synthesizer.

2. The frequency synthesizer of claim 1, wherein the fine tune phase locked loop includes a divide by D element operable to receive the fine tune signal having a frequency $f_R \cdot P$, where D is an integer, and an output of the divide by D element also comprises an output of the fine tune phase locked loop and provides a signal frequency proportional to $f_R \cdot P/D$ which comprises the divided down signal.

3. The frequency synthesizer of claim 1, wherein the fine tune phase locked loop includes a divide by $N_R$ element operable to receive the input reference signal having a frequency $f_R$, where $N_R$ is an integer, and a divide by D element operable to receive the fine tune signal having a frequency $f_R \cdot P$, where D is an integer, and an output of the divide by D element also comprises an output of the fine tune phase locked loop and provides a signal frequency proportional to $f_R \cdot P/D \cdot N_R$ which comprises the divided down signal.

4. The frequency synthesizer of claim 3, wherein P, A, D, and $N_R$ are programmable.

5. The frequency synthesizer of claim 3, where A is less than P, and D is greater than $N_R$.

6. The frequency synthesizer of claim 3, further comprising a frequency modulation circuit coupled to the fine tune phase locked loop to operate therethrough, whereby the frequency synthesizer outputs a narrow band FM signal modulated by a modulating signal and filtered at the translation PLL, providing broader bandwidths into the microwave frequency ranges.

7. The frequency synthesizer of claim 1, wherein all the elements of the frequency synthesizer are on a single integrated circuit chip.

8. The frequency synthesizer of claim 1, wherein the translation phase locked loop comprises:
- a low pass filter coupled to receive the mixed signal output of the Gilbert cell double balanced mixer and to produce a filtered output signal;
- a phase detector coupled to receive the divided down fine tune signal and the filtered output signal of the low pass filter and to output a phase detection signal;
- a loop filter coupled to receive the phase detection signal and to output a tune voltage; p1 a voltage controlled oscillator coupled to receive the tune voltage output of the loop filter and generate a signal frequency proportion to the tune voltage; and
- a Gilbert cell double balanced mixer coupled between the coarse tune and the translation phase locked loops, wherein the Gilbert cell mixer combines the coarse tune signal and the divided down output signal of the fine tune phase locked loop and couples the mixed signal into the low pass filter of the translation loop, whereby an output signal is generated with a frequency which is proportional to the linear sum of the coarse tune signal and the fine tune signal.

9. The frequency synthesizer of claim 8, wherein the low pass filter is coupled to receive the output of the Gilbert cell double balanced mixer, comprises elements using a sigma-delta modulation smoothing technique.

10. The frequency synthesizer of claim 1, wherein the fine tune and coarse tune phase locked loops comprises:
- a phase detector operably coupled to receive the input reference signal having a frequency $f_R$ and a divided down feedback signal, and to generate a phase detection signal;
- a loop filter operably coupled to receive the phase detection signal and output a tune voltage;
- an oscillator operably coupled to the loop filter to receive the tune voltage and generate a signal frequency proportion to the tune voltage; and
- a divider operably coupled between an input of the phase detector and the oscillator output which is the phase locked loop output, and operable to generate the divided down feedback signal, which is a lower frequency signal of the oscillator output.

11. The frequency synthesizer of claim 10, wherein the divider within the fine tune and coarse tune phase locked loops comprises:
- a dual modulus prescaler operably coupled to receive the phase locked loop output, wherein the dual modulus prescaler comprises a divide by $n_M$ or $n_M+1$ element, where $n_M$ or $n_M+1$ is an integer, and generates a divide by $n_M$ or $n_M+1$ result output from the operation of the elements;
- a swallow divider operably coupled to the dual modulus prescaler, wherein the swallow divider comprises a divide by $n_S$ element, where $n_S$ is an integer, and determines a modulation frequency M for the dual modulus prescaler; and
- a programmable divide by $n_P$ element operably coupled to the output of the dual modulus prescaler, where $n_P$ is an integer, and wherein the divide by $n_P$ element is operable to divide the dual modulus prescaler output signal frequency by $n_P$, whereby the divider provides a signal frequency proportional to $(n_M \cdot n_P + n_S) f_{REF}$ or $(n_M + 1 \cdot n_P + n_S) f_{REF}$ which comprises the divided down feedback signal.

12. The frequency synthesizer of claim 1, further comprising:
- a divide by D element coupled between the fine tune and the translation phase locked loops; and
- a divide by $N_R$ element coupled between the input terminal and the fine tune phase locked loop.

13. The frequency synthesizer of claim 1, further comprising:
- a first lock detector circuit coupled to the fine tune phase locked loop;
- a second lock detector circuit couple to the coarse tune phase locked loop;
- an AND gate coupled to receive the outputs of the first and second lock detectors circuits; and
- a sweep circuit coupled to receive the logical output of the AND gate, and generate a sweep signal associated with the translation loop VCO, wherein when a lock condition is detected in both the first and second lock detector, the sweep signal is initiated which generates a frequency sweep of the translation loop VCO to establish a translation loop lock condition at the frequency of the upper sideband mixing product.

14. A method of synthesizing a signal from a lower frequency reference signal, comprising:
- providing a fine tune phase locked loop having an input terminal and a coarse tune phase locked loop having an input terminal;
- inputting a reference signal with a frequency $f_R$ and applying the reference signal to the input terminals of the fine tune phase locked loop and the coarse tune phase locked loop;
- multiplying a frequency $f_R$ of the reference signal by a factor P in the fine tune phase locked loop to generate a fine tune signal;
- multiplying a frequency $f_R$ of the reference signal by a factor A in the coarse tune phase locked loop to generate a coarse tune signal;
- applying the fine tune signal to a translation phase locked loop; and
- Gilbert cell double balanced mixer summing the coarse tune signal and a divided down output of the fine tune signal and coupling the mixed signal into the translation phase locked loop to generate an output signal having a higher frequency proportional to $f_R P / D \cdot N_R + A$).

15. The method of claim 14, further comprising:
- dividing the reference signal by a factor $N_R$ prior to applying the reference signal to the fine tune phase locked loop; and
- dividing the fine tune signal by a factor D prior to applying the fine tune signal to the translation loop phase locked loop.

16. The method of claim 14, further comprising a lock detection and sweep operation comprising:
- applying the fine tune loop phase detector inputs to a fine tune lock detector circuit;
- applying the coarse tune loop phase detector inputs to a coarse tune lock detector circuit;
- applying the fine and coarse tune lock detector circuit outputs to an AND gate;
- logically ANDing the fine and coarse tune lock detector circuit outputs to indicate when both have achieved lock;
- applying the AND gate output to a one-shot circuit to generate a pulse;
- applying the one-shot pulse to initiate a sweep circuit associated with a loop filter of the translation loop;
- generating a ramp waveform within the sweep circuit;
- applying the sweep circuit ramp waveform to a VCO of the translation loop;
- sweeping the translation loop VCO; and determining if the translation loop has established a lock condition at an upper sideband mixing product while sweeping the translation loop VCO, wherein when lock has been established, the sweep signal is discontinued and disabled from further one-shot initiation pulses, otherwise continuing the VCO sweep until lock is established or the minimum frequency is achieved, and ending the lock detection and sweep operation.

* * * * *